US006408015B1

(12) United States Patent
Kaneko

(10) Patent No.: US 6,408,015 B1
(45) Date of Patent: Jun. 18, 2002

(54) MIRROR ADAPTED FOR USE IN SEMICONDUCTOR LASERS AND METHOD FOR FABRICATING THE SAME

(75) Inventor: Yasuhisa Kaneko, Kawasaki Kanagawa (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/376,764

(22) Filed: Aug. 17, 1999

(30) Foreign Application Priority Data

Sep. 4, 1998 (JP) .......................................... 10-251556

(51) Int. Cl.[7] ................................................ H01S 5/00
(52) U.S. Cl. ............................. 372/50; 372/50; 372/40; 372/45; 372/99
(58) Field of Search ............................. 372/99, 40, 45, 372/50, 43, 34, 41; 257/440, 451, 431; 359/584, 359, 585

(56) References Cited

U.S. PATENT DOCUMENTS 5,146,465 A    9/1992   Khan et al. ................... 372/45

FOREIGN PATENT DOCUMENTS

JP    09045987    2/1997   ............. H01S/3/18
JP    09-116613   5/1997

OTHER PUBLICATIONS

Khan et al., "Growth of High Optical and Electrical Quality GaN Layers using Low Pressure Metalorganic Chemical Vapor Deposition", Applied Physics Letters, vol. 58, No. 5, pp. 526–527.
Khan et al., "Vertical–Cavity Stimulated Emission from Photopumped InGaN/GaN Heterojunctions at Room Temperature", Applied Physics Letters, vol. 65, No. 5, pp. 520–521.
S. Nakamura, et al, "InGaN/GaN/AlGaN–Based Laser Diodes with Modulation–Doped Strained–Layer Superlattices" Jpn. J. Appl. Phys., vol. 36(1997), pp. L1568–L1571.

Akira Usui et al., "Thick GaN Epitaxial Growth with Low Dislocations Density by Hydride Vapor Phase Epitaxy", Jpn. J. Appl. Phys., vol. 36(1997), pp. L899–L902.
T. Someya et al., "MOVPE Growth of Conductive GaN/AlGaN DBR", Abstracts of The 47th Spring Meeting of the Japan Society of Applied Physics, 28a–ZS–3, 1998.
Joan M. Redwing, "An Optically Pumped GaN–AlGaN Vertical Cavity Surface Emitting Laser", Appl. Phys. Lett. 69(1), Jul. 1, 1996, pp. 1–3.
T. Honda et al., "Design and Fabrication Processes Consideration of GaN–Based Surface Emitting Lasers", Trans. IEICE, C–11, vol. J81–C–II, No. 1, pp. 97–104.

*Primary Examiner*—Paul Ip
*Assistant Examiner*—Delma R. Flores Ruiz

(57) ABSTRACT

A mirror for use in a semiconductor laser. The mirror consists a total of four or more alternating layers of a low refractive index semiconductor material having an index of refraction of $n_1$ and a high refractive index semiconductor material having an index of refraction of $n_2$ where $n_2 > n_1$. A first one of the layers is grown at a temperature, referred to as the "low temperature", such that the layer is in a substantially amorphous state, and a second one of the layers is grown at a temperature, referred to as the "high temperature", such that the layer is in a substantially monocrystalline state. The first one of the layers and the second one of the layers correspond to layers having different indices of refraction. The thickness, $T_L$, of the layer grown at the low temperature satisfies $$T_L = \{\lambda/(4 \times n_L)\}(2M-1) < 0.1 \; \mu m$$

where $\lambda$ is the wavelength of the light emitted by the laser, $n_L$ is the refractive index of the layer grown at the low temperature, and M is a positive integer. The thickness, $T_H$, of the layer grown at the high temperature satisfies $$T_H = \{\lambda/(4 \times n_H)\}(2N-1) > 0.2 \; \mu m$$

where $n_H$ is the refractive index of the layer grown at the high temperature, and N is a positive integer. The first and second materials are preferably Group III–V nitrides such as $Al_xGa_{1-x}N$, where $x = 0.3$ to 1, and GaN.

5 Claims, 6 Drawing Sheets

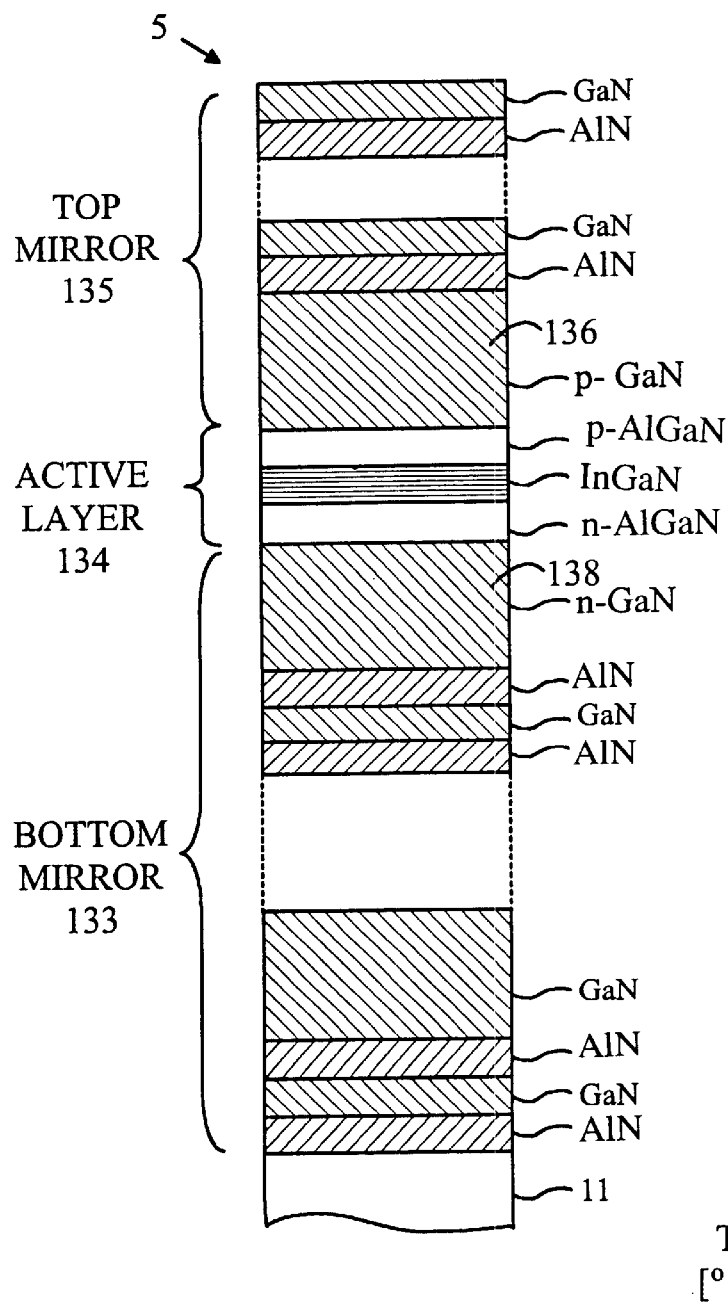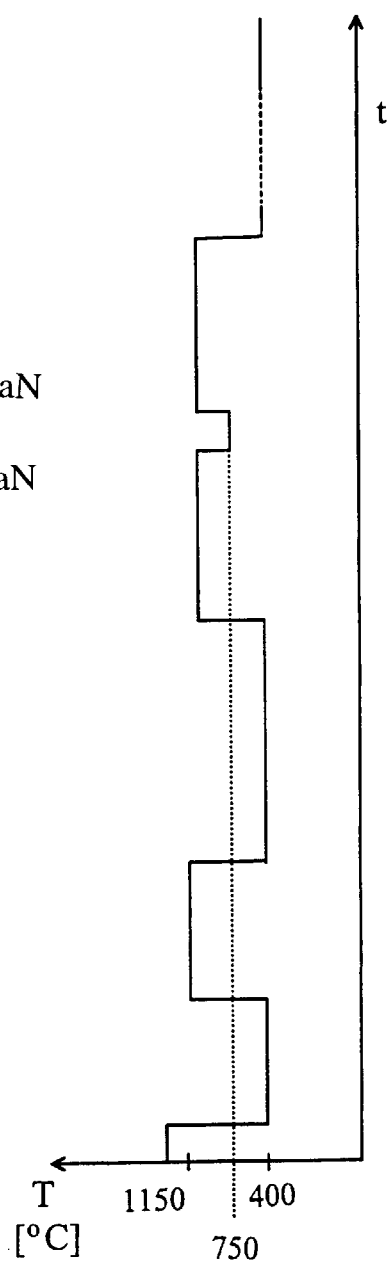
FIGURE 4A
FIGURE 4B

MIRROR ADAPTED FOR USE IN SEMICONDUCTOR LASERS AND METHOD FOR FABRICATING THE SAME

FIELD OF THE INVENTION

The present invention relates to semiconductor lasers, and more particularly, to the fabrication of mirror elements in such lasers.

BACKGROUND OF THE INVENTION

Semiconductor lasers are widely used in optical disk drives and the like to write or read data. Since the density of data that can be stored on optical disks depends on the wavelength of the laser used to read and write the data, semiconductor lasers for generating light at short wavelengths are actively being pursued. Lasers based on Group III–V lasers emit light in the blue wavelengths; however, commercialization of this technology has been hampered by a number of problems.

There are two general types of semiconductor lasers, edge-emitting lasers and surface-emitting lasers. In edge-emitting lasers, the laser cavity is formed by utilizing cleaved facets to form the mirrors that define the edges of the cavity. Light exits the laser in a direction parallel to the substrate surface. While edge-emitting lasers are relatively easy to produce in single quantities, this technology cannot be easily utilized to form two-dimensional arrays of lasers. In addition, the cross-section of the laser generated light beam is rectangular, whereas circular beam cross-sections are preferred.

In contrast, surface-emitting lasers emit light in a direction perpendicular to the surface of the substrate. This type of laser lends itself to the construction of two-dimensional arrays. In addition, the cross-section of the laser beam can be controlled using conventional masking techniques, and hence, beams having circular cross-sections are easily obtained.

Unfortunately, the construction of surface-emitting lasers is much more complex than edge-emitting lasers. In surface-emitting lasers, the mirrors are deposited as layers that are parallel to the substrate surface. While a number of technologies can be utilized to form the mirrors, semiconductor multi-layer film methods are preferred because the generation of the multilayer film utilizes the same equipment and process steps as the other layers in the laser structure. For example, a multilayer film reflective mirror composed of GaN layers and In AlN layers is disclosed in Unexamined Japanese Patent Publication No. HEI 7-297476. Unexamined Japanese Patent Publication No. HEI 7-335975 discloses a multilayer reflective mirror composed of two types of AlGaN layers having different composition ratios of Al, Ga, and N.

While these Group III–V nitride semiconductor surface-emitting lasers have advantages over edge-emitting lasers as discussed above, extending the lifetime, decreasing the threshold current, obtaining higher power output, and lowering manufacturing costs are needed. Significant progress toward these goals could be achieved if the number of layers in the mirrors could be reduced and the size and density of defects in the mirror layers could also be reduced.

The number of layers required to fabricate a mirror of a given reflectivity depends on the ratio of the indices of refraction of the layers. As noted above, the mirrors are formed by cyclically depositing layers of different indices of refraction. Typically, a repeated two-layer structure is utilized. The layers differ in index of refraction; hence, light will be partially reflected at the interface of the layers. The fraction of the light that is reflected at each interface depends on the ratio of the indices of refraction, greater ratios providing higher reflectivity. The thickness of the layers is chosen such that the light reflected from each boundary will add coherently. Hence, multilayer structures having the greatest difference in refractive index are preferred because fewer layers are needed.

Unfortunately, in prior art devices, the size and density of defects in the layers increases as the index of refraction ratio increases when Group III–V nitride semiconductors are utilized. In these material systems, materials with substantially different indices of refraction also have substantially different lattice constants. The lattice constant mismatch between the layers leads to defects in the layers. Hence, designers have been faced with a tradeoff between the number of mirror layers and the defect density in the mirror layers. If layers having small lattice constant mismatches are used to reduce defect density, a larger number of layers must be utilized to obtain the desired reflectivity. The increased number of layers leads to increased fabrication costs and higher threshold currents. The higher threshold currents also lead to increased heat generation and a reduction in device lifetime. If layers having high differences in index of refraction are used, defect densities increase, cracks are generated and device yield decreases leading to higher device cost.

A number of methods for reducing defects have been reported. For example, in epitaxial lateral overgrowth (ELOG), a GaN layer is grown at a high temperature on the substrate. A $SiO_2$ layer is in strips having widths of several microns on the surface of the GaN layer. Then GaN is grown over the $SiO_2$ strips by seeding further epitaxial growth from the GaN areas between the strips. The GaN that is formed over the $SiO_2$ in this manner is substantially defect-free except for a defect at the point at which the overgrowth from the two sides of the $SiO_2$ strip meets. Unfortunately, this method does not lend itself to the formation of the mirror layers described above.

A second method for reducing defects is referred to as the double buffer method. In the double buffer method, an amorphous GaN layer or AlN layer is grown to a thickness of several dozen nanometers on the substrate. A flat layer is then formed on top of this layer by growing a crystalline GaN layer having a thickness of several microns. This growing process is repeated twice to provide a GaN layer with reduced levels of defects. The double buffer technique is disclosed in the specification of Japanese Patent Application No. HEI 9-30215.

Broadly, it is the object of the present invention to provide an improved method for fabricating mirror layers in semiconductor lasers.

It is a further object of the present invention to provide a method for fabricating mirror layers that allows group III–V materials with substantially different lattice constants to be utilized while maintaining acceptable defect densities.

These and other objects of the present invention will become apparent to those skilled in the art from the following detailed description of the invention and the accompanying drawings.

SUMMARY OF THE INVENTION

The present invention is a mirror for use in a semiconductor laser. The mirror consists a total of four or more alternating layers of a low refractive index semiconductor material having an index of refraction of $n_1$ and a high refractive index semiconductor material having an index of refraction of $n_2$ where $n_2>n_1$. A first one of the layers is grown at a temperature, referred to as the "low temperature", such that the layer is in a substantially amorphous state, and a second one of the layers is grown at a temperature, referred to as the "high temperature", such that the layer is in a substantially monocrystalline state. The first one of the layers and the second one of the layers correspond to layers having different indices of refraction. The thickness, $T_L$, of the layer grown at the low temperature satisfies $$T_L=\{\lambda/(4 \times n_L)\}(2M-1)<0.1 \, \mu m$$

where $\lambda$ is the wavelength of the light emitted by the laser, $n_L$ is the refractive index of the layer grown at the low temperature, and M is a positive integer. The thickness, $T_H$, of the layer grown at the high temperature satisfies $$T_H=\{\lambda/(4 \times n_H)\}(2N-1)>0.2 \, \mu m$$

where $n_H$ is the refractive index of the layer grown at the high temperature, and N is a positive integer. The first and second materials are preferably Group III–V nitrides such as $Al_xGa_{1-x}N$, where x=0.3 to 1, and GaN.

BRIEF DESCRIPTION OF THE DRAWINGS

FIGS. 4A–4B illustrate the manner in which the present invention may be utilized to form a surface-emitting laser.

DETAILED DESCRIPTION OF THE INVENTION

Figure 1A:
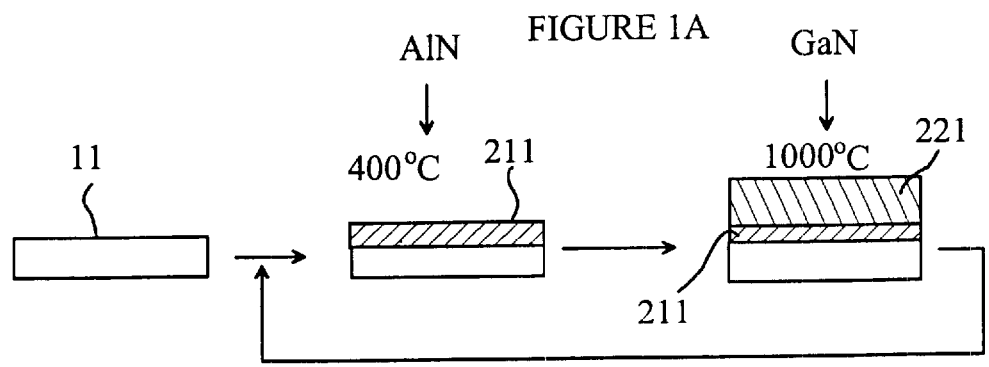
FIGS. 1A–1C illustrate the fabrication of a mirror constructed from layers of GaN and AlN on a sapphire substrate.

To simplify the following discussion, the layers that are grown to form the various mirror layers will be characterized by the temperature at which the layer is grown and by the relative index of refraction of the layers. The mirror layer having the lower index of refraction will be referred to as a "low refractive index layer", and the layer having the higher index of refraction will be referred to as a "high refractive index layer". However, it is to be understood that these terms are relative and do not denote any specific index of refraction value. Similarly, the layers will be labeled by the temperatures with which the layers are grown. A "low temperature" layer refers to a layer that is grown at a temperature such that the resulting layer is substantially amorphous; while a "high temperature" layer refers to a layer that is grown at a temperature that produces a substantially monocrystalline material.

The present invention is based on the observation that a relatively thick high temperature layer grown on top of a thin low temperature layer has acceptable defect densities even when the two materials have significantly different lattice constants. To provide mirror layers, the thicknesses are constrained by the requirement that reflections from the various mirror layer interfaces must add coherently.

The relative thicknesses of the layers are chosen to minimize the defects while providing a satisfactory crystalline state in the high temperature layer. As noted above, the thicknesses are also constrained by the need for coherent addition of the reflected light. This last constraint is satisfied if the layer thicknesses are chosen to be $\{\lambda/(4 \times n)\} \times (2K-1)$, where $\lambda$ is the wavelength of the light to be generated by the device, n is the index of refraction of the material in the layer, and K is a positive integer.

For example, the thicknesses of the low and high temperature layers, $T_L$ and $T_H$, are preferably chosen such that $$T_L=\{\lambda/(4 \times n_L)\}(2M-1)<0.1 \, \mu m$$

where $\lambda$ is the wavelength of the light emitted from the laser, $n_L$ is the refractive index of the layer formed by low temperature growth, and M=1, 2, 3, . . . , and $$T_H=\{\lambda/(4 \times n_H)\}(2N-1)>0.2 \, \mu m$$

where $n_H$ is the refractive index of the layer formed by high temperature growth, and N=1, 2, 3, . . . .

The preferred Group III–V nitride materials for forming the low and high refractive index layers are AlN/GaN, AlGaN/GaN, InGaN/GaN or BGaN/GaN. When the AlGaN/GaN is used for the low and high refractive index layers, the AlGaN layer preferably has the composition $Al_xGa_{1-x}N$ (where x=0.3 to 1).

In general, a mirror according to the present invention is constructed by first forming a buffer layer utilizing low temperature growth on a substrate such as sapphire. Then the semiconductor layers are deposited on the buffer layer, the high refractive index layer being formed on the buffer layer and then the low refractive index layer being formed on the high refractive index layer. The buffer layer can be a single layer or multiple layers.

The present invention may be practiced on a wide range of substrates in addition to the sapphire substrate discussed above. For example, SiC, or $MgAl_2O_4$, may be used as the substrate. It should also be noted that a mirror according to the present invention does not need to be formed on the surface of the substrate or buffer layer. For example, in an edge-emitting semiconductor laser, a mirror according to the present invention can be formed on the edge surface of the substrate.

The manner in which the present invention provides its advantages can be more easily understood in the context of a number of exemplary mirror and/or laser devices. In the following examples, GaN and AlN are used as the high refractive index and low refractive index layers forming the mirror, and sapphire is used as the substrate. However, it will be obvious to those skilled in the art from the following discussion that the teachings of the present invention can be applied to other materials and substrates.

Figure 1B:
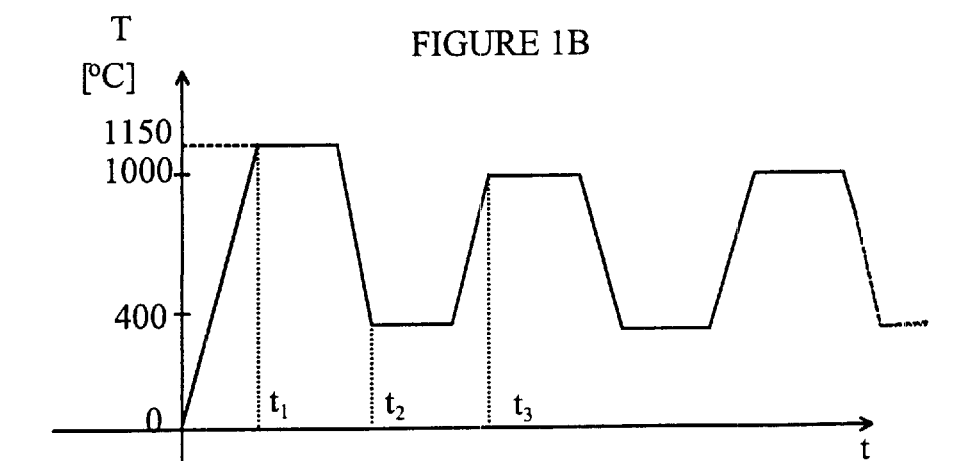
Figure 1C:
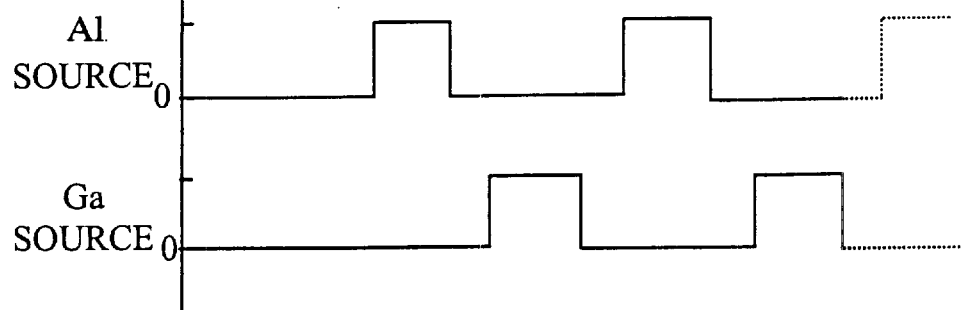
Figure 1C:
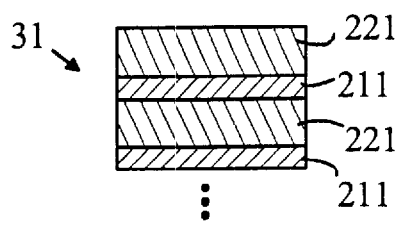
Figure 1C:
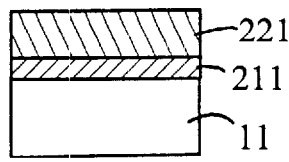

Refer now to FIGS. 1A–1C, which illustrate the fabrication of a mirror constructed from layers of GaN and AlN on a sapphire substrate. GaN has a refractive index of 2.67 and AlN has a refractive index of 2.20; hence, the GaN layer is the high refractive index layer and the AlN layer is the low refractive index layer. These materials have a lattice mismatch of about 2%. These materials also have a very large lattice mis-match with respect to the sapphire substrate. GaN has a lattice constant of 3.1 and sapphire has a lattice constant of 4.8.

FIG. 1A illustrates the deposition process used to generate the various mirror layers. FIG. 1B illustrates the temperature changes of the nitrogen-containing (NH$_3$) atmosphere in the growth chamber during the deposition as a function of time, t. In addition, flow rates for the Ga source and the Al source are also plotted in FIG. 1B. FIG. 1C is a cross-sectional view of the resulting mirror.

The surface of sapphire substrate 11 is first cleaned in the nitrogen atmosphere at approximately 1,150° C. as shown at $t_1$ in FIGS. 1A and 1B. The temperature of the atmosphere is then lowered to approximately 400° C. as shown at $t_2$ in FIG. 1B. The AlN low refractive index layer 211 is then grown on the sapphire substrate 11 to a thickness of 45.4 nm which corresponds to a thickness of $\lambda/(4 \times n_{AlN})$ for $\lambda$=400 nm. Next, the temperature of the atmosphere is raised from 400° C. to approximately 1,000° C. as shown at $t_3$ in FIG. 1B. The GaN high refractive index layer 221 is then grown on the AlN low refractive index layer 211 to a thickness of 5×37.4 nm which corresponds to $5\times\lambda/(4\times n_{AlN})$.

The process is then repeated. The next AlN low refractive index layer 211 is deposited at 400° C. The temperature is then raised to 1,000° C., and the next GaN high refractive index layer 221 is deposited. In this example, a mirror having 13 pairs of AMN/GaN layers has a reflectivity of 99.0% at a wavelength of 400 nm. If the number of pairs of layers is increased to 15, a reflectivity of 99.5% is obtained. When the number of pairs is increased to 19, a reflectivity of 99.9% is obtained.

In this embodiment, the first AlN layer formed by low temperature growth and the GaN layer formed thereon under high temperature growth conditions also function as a buffer layer for reducing threading dislocations caused by the lattice mismatch between sapphire and GaN.

In the embodiment described above, the low refractive index layers were formed growth at the low temperature, and the high refractive index layers were formed by growth at the high temperature. However, embodiments in which the low refractive index layers are formed by growth at the high temperature, and the high refractive index layers are formed by growth at the low temperature can also be practiced.

Figure 2A:
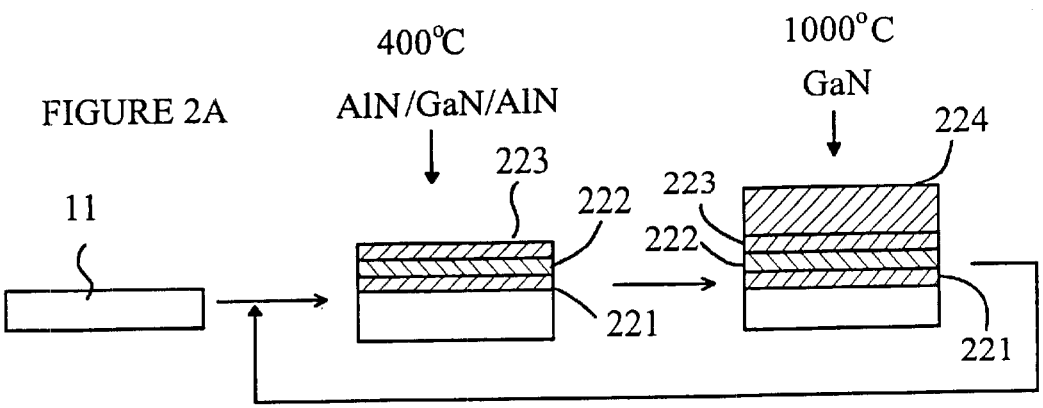
FIGS. 2A–2C illustrate an embodiment of the present invention in which the layers of the low refractive index material are formed by growth at the low temperature and the layers of high refractive index material are formed alternately by growth at the low temperature and growth at the high temperature.
Figure 2B:
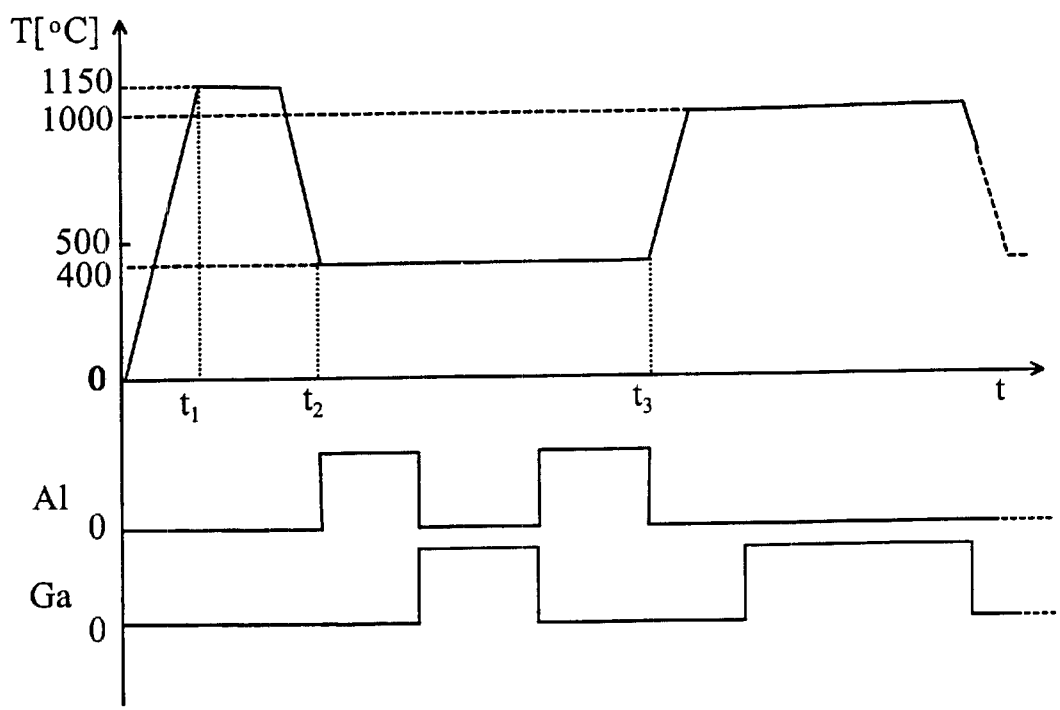
Figure 2C:
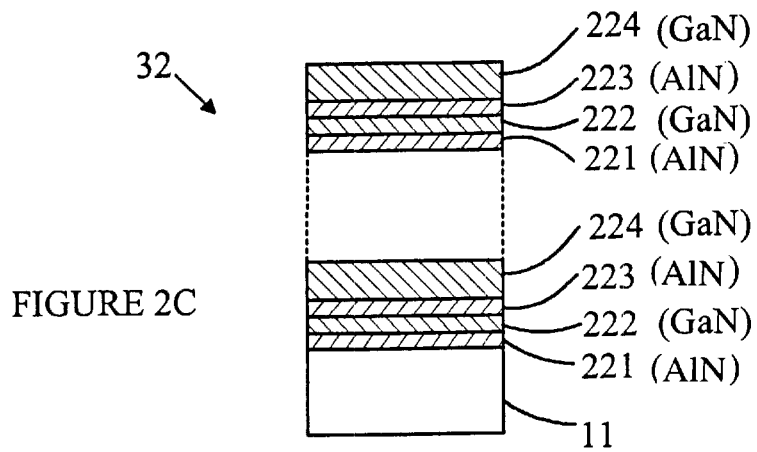

Refer now to FIGS. 2A–2C, which illustrate an embodiment of the present invention in which the layers of the low refractive index material are formed by low temperature growth and the layers of high refractive index material are formed alternatively by low temperature growth and by high temperature growth. FIG. 2A is a diagrammatic view of the deposition process. FIG. 2B is a graph of the temperature T of the atmosphere as a function of time, t, and the flow rates for the Ga and Al sources. FIG. 2C is a cross-sectional view of the resultant mirror 32.

In a manner similar to that described above, the sapphire substrate 11 is first cleaned at a temperature of approximately 1,150° C. as shown at time to in FIG. 2B. The temperature of the nitrogen atmosphere is then lowered to approximately 400° C. as shown at $t_2$. An AlN low refractive index layer 221 is then grown on the sapphire substrate 11 to a thickness of $\lambda/(4\times n_{AlN})$. Next, a GaN high refractive index layer 222 is grown on the AlN low refractive index layer 221 to a thickness of $\lambda/(4\times n_{GaN})$. A second low temperature AlN low refractive index layer 223 is then grown on the GaN high refractive index layer 222 to a thickness of $\lambda/(4\times n_{AlN})$.

Next, the temperature in the deposition chamber is increased to approximately 1,000° C. as shown at time $t_3$. A GaN high refractive index layer 224 is then grown on the AlN low refractive index layer 223 to a thickness of $5\times\lambda/(4\times n_{GaN})$. This four layer deposition process is then repeated until mirror 32 has 13 pairs of AlN/GaN layers as shown in FIG. 2C. This embodiment of the present invention also provides a reflectivity of 99.0% reflectivity at a wavelength of 400 nm. The main advantage of this embodiment over that shown in FIG. 1 is that the number of temperature cycles is half that of the embodiment shown in FIG. 1, and hence, equilibration times are reduced and temperature control is simplified.

Figure 3A:
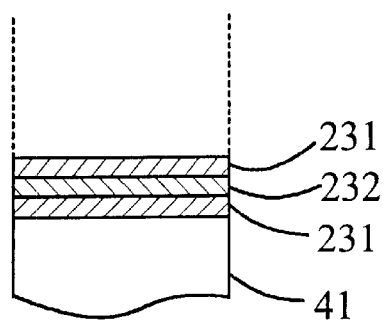
FIGS. 3A–3C illustrate the manner in which an upper mirror is formed using low temperature growth for forming both the low refractive index layers and the high refractive index layers.
Figure 3B:
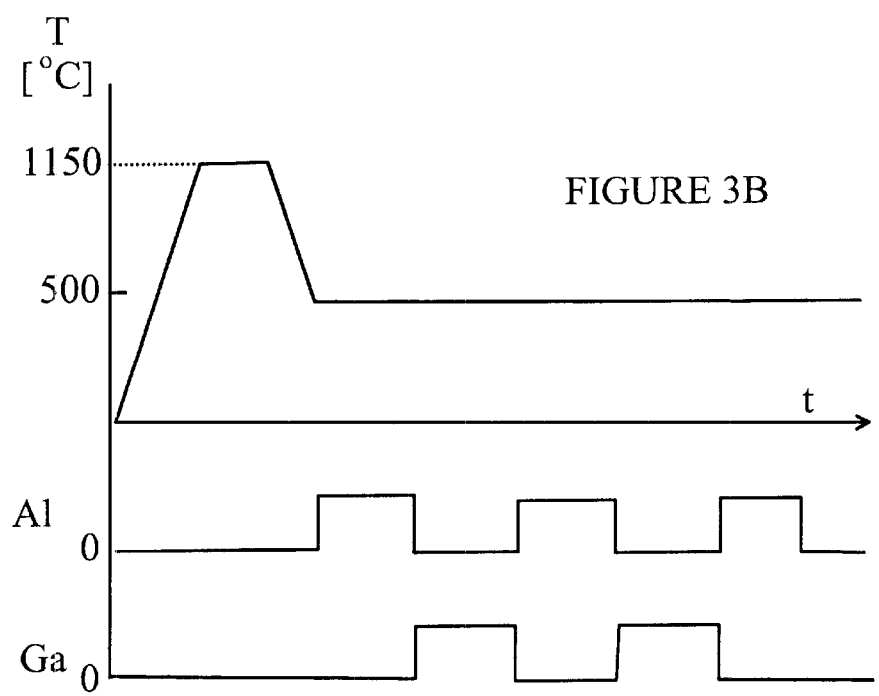
Figure 3C:
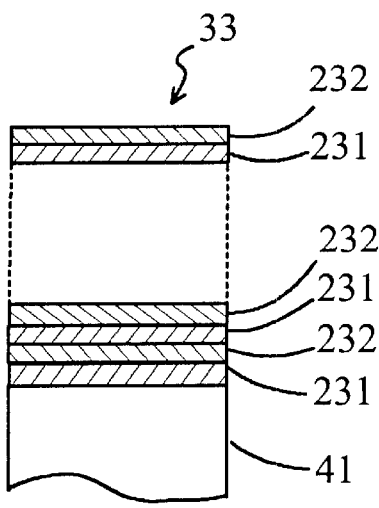

Refer now to FIGS. 3A–3C, which illustrate the manner in which an upper mirror 33 can be formed using low temperature growth for forming both the low refractive index layers and the high refractive index layers. FIG. 3A is a cross-sectional view of a portion of an upper mirror during the deposition process. FIG. 3B is a graph of the deposition temperature as a function of time, t. The states of the Ga and Al sources as a function of time are also shown in FIG. 3B. FIG. 3C is a cross-sectional view of mirror 33 after the various layers have been deposited.

In this embodiment, it is assumed that the mirror is being formed on a semiconductor layer 41 that is substantially free of dislocations. Hence, all of the mirror layers can be deposited at low temperature. First, the surface is cleaned in an atmosphere at a temperature of approximately 1,150° C. The temperature is then lowered to 400° C. An AlN low refractive index layer 231 is then grown to a thickness of $\lambda/(4\times n_{AlN})$ on the semiconductor layer 41, and a GaN high refractive index layer 232 is grown to a thickness of $\lambda/(4\times n_{GaN})$ on the AlN low refractive index layer 231. The process is repeated until 13 AlN/GaN pairs have been deposited as shown in FIG. 3C. Mirror 33 has a reflectively of 99% at a wavelength of 400 nm.

Refer now to FIGS. 4A–4B, which illustrate the manner in which the teachings of the present invention may be utilized to form a surface-emitting laser 5. FIG. 4A is a cross-sectional view of laser 5, and FIG. 4B is a plot of the deposition temperature at various stages in the fabrication process. After cleaning the sapphire substrate 11 at 1150° C., the layered structure which becomes the lower mirror 133 is deposited in the manner discussed with reference to the lower mirror embodiment shown in FIGS. 2A–2C. The layered structure that is to become the active layer 134 is then deposited. Finally, the layered structure that becomes the upper mirror 135 is deposited in a manner analogous to that discussed above with respect to the upper mirror discussed in FIGS. 3A–3C.

When active layer 134 is formed, the n-AlGaN is grown to a thickness of $\lambda/(4\times n_{GaN})$ (where $n_{AlGaN}$ is the refractive index of the AlGaN layer) at a temperature of 1,000° on top of lower mirror 133. The last layer of mirror 133 is a GaN high refractive index layer that is also formed at a high temperature (1000° C). The temperature of the atmosphere in the deposition chamber is then lowered to 750° C., and an InGaN multiple quantum well (MQW) layer is formed on the n-AlGaN. The deposition temperature is then raised to 1,000° C., and the p-AlGaN is grown to a thickness of $\lambda/(4\times n_{AlGaN})$. Then GaN is grown to a thickness of $5\times\lambda/(4\times n_{GaN})$ on the p-AlGaN layer.

As can be seen from FIGS. 4A–4B, the final layer of lower mirror 133 is a GaN layer that is grown at high temperature to provide a single crystal on which active layer 134 is grown. This procedure reduces the lattice defects in active layer 134.

Figure 5A:
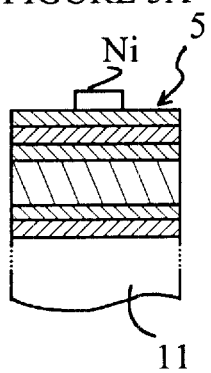
FIGS. 5A–5J are cross-sectional views of a laser at various stages in the fabrication process.
Figure 5B:
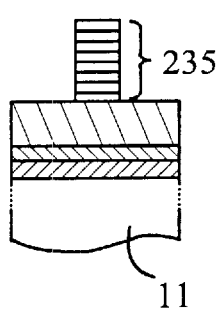
Figure 5C:
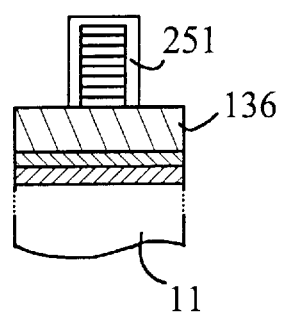
Figure 5D:
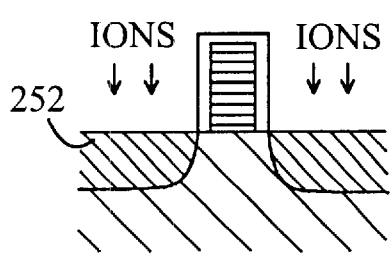
Figure 5E:
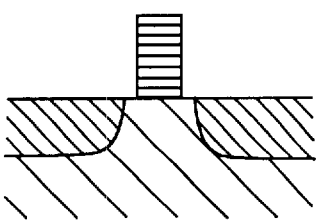
Figure 5F:
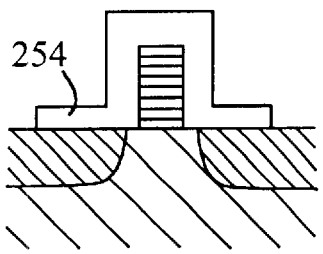
Figure 5G:
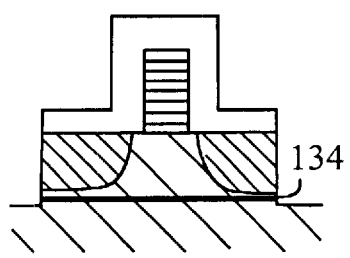
Figure 5H:
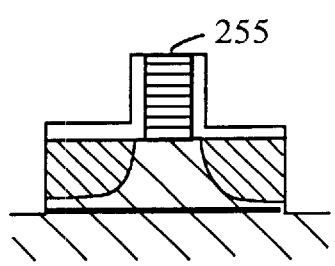
Figure 5I:
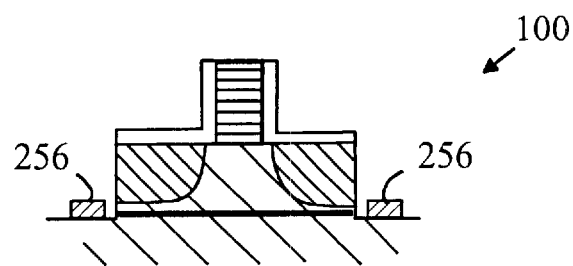
Figure 5J:
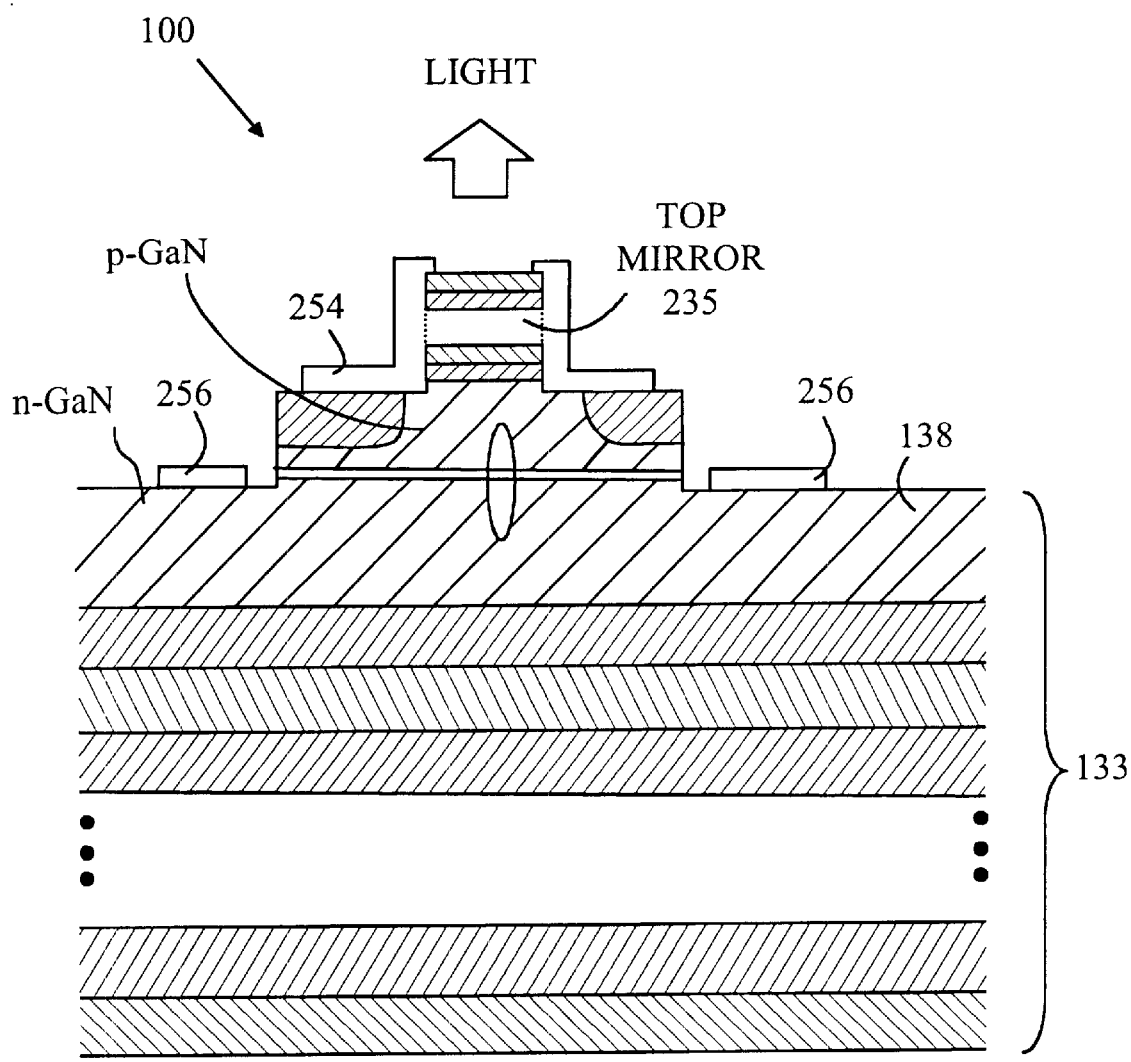

The manner in which a surface-emitting laser is fabricated from the layered structure described above will now be described with reference to FIGS. 5A–5J, which are cross-sectional views of a laser 100 at various stages in the fabrication process. First, a Ni patterned area is formed on the layered structure 5 as shown in FIG. 5A. The top layers of the layered structure 5 are etched by reactive ion etching (RIE) until the p-GaN layer 136 shown in FIG. 4A is reached to form the upper mirror 235 as shown in FIG. 5B. Next, a resist pattern 251 is formed to cover the entire upper mirror 235 as shown in FIG. 5C. Ions are implanted into p-GaN layer 136 to increase the resistance of an area 252 around the upper mirror as shown in FIG. 5D. The resist is then removed as shown in FIG. 5E, and a, Ni/Au/Ni layer 254 is deposited over the upper mirror and a portion of the implanted region as shown in FIG. 5F. The areas of the layered structure 5 that are not protected by Ni/Au/Ni layer 254 are etched back to the n-GaN layer 138 in the bottom mirror 133 using RIE as shown in FIG. 5G. Next, the Ni/Au/Ni layers in the center of the upper mirror are etched to open the light-emitting aperture 255 as shown in FIG. 5H. After annealing, Al/Ti layers are deposited to provide the n-contacts 256 as shown in FIG. 5I. A more detailed cross-sectional view of the completed laser 100 is shown in FIG. 5J.

Various modifications to the present invention will become apparent to those skilled in the art from the foregoing description and accompanying drawings. Accordingly, the present invention is to be limited solely by the scope of the following claims.

What is claimed is:

1. A surface-emitting semiconductor laser comprising:
   a substrate;
   a lower mirror consisting of a total of four or more alternating layers of a low refractive index semiconductor material having an index of refraction of $n_1$ and a high refractive index semiconductor material having an index of refraction of $n_2$ wherein $n_2 > n_1$, a first one of said layers being in an amorphous state and a second one of said layers being in a monocrystalline state, said first one of said layers and said second one of said layers having different indices of refraction;
   an active region for generating light; and
   an upper mirror, wherein said active region is located between said lower and upper mirrors and wherein said lower mirror is located between said substrate and said active region.

2. The laser of claim 1 wherein said upper mirror comprises four or more alternating layers of said first material and said second material, said layers being in an amorphous state.

3. The laser of claim 1 wherein said substrate comprises sapphire, SiC, or $MgAl_2O_4$.

4. The laser of claim 1 wherein said first and second materials are Group III–V nitrides.

5. The laser of claim 4 wherein said first material is $Al_xGa_{1-x}$N, where x=0.3 to 1, and said second material is GaN.

* * * * *